United States Patent [19]

Berger et al.

[11] Patent Number: 4,477,835
[45] Date of Patent: Oct. 16, 1984

[54] CHARGE TRANSFER PHOTOSENSITIVE DEVICE

[75] Inventors: Jean L. Berger; Pierrick Descure, both of Paris, France

[73] Assignee: Thomson-CSF, Paris, France

[21] Appl. No.: 356,340

[22] Filed: Mar. 9, 1982

[30] Foreign Application Priority Data

Mar. 13, 1981 [FR] France .................. 81 05136

[51] Int. Cl.³ .................. H04N 3/15; H04N 9/07
[52] U.S. Cl. .................. 358/213
[58] Field of Search .................. 358/213, 41, 44; 357/24, 30, 32

[56] References Cited

U.S. PATENT DOCUMENTS

| | | | |
|---|---|---|---|
| 4,145,803 | 3/1979 | Tasch | 29/571 |
| 4,169,273 | 9/1979 | Hendrickson | 358/213 |
| 4,198,646 | 4/1980 | Alexander et al. | 357/30 |
| 4,200,892 | 4/1980 | Weimer | 358/213 |
| 4,242,700 | 12/1980 | Weimer | 358/213 |
| 4,336,556 | 6/1982 | Sekine | 358/213 |

FOREIGN PATENT DOCUMENTS

2367353  5/1978  France .

*Primary Examiner*—Michael A. Masinick
*Attorney, Agent, or Firm*—Roland Plottel

[57] ABSTRACT

A charge transfer photosensitive device, having a plurality of photosensitive zones (20) fabricated on a single conducting substrate, and having N lines and M columns, and insulated from one another. In the photosensitive zones electrical charges are created depending upon light received. Each of these zones is formed by a MOS capacitance (3) and a charge collecting diode (8). A plurality of reading diodes (5) read the charges collected in the photosensitive zones; and a screen grid (4) is placed between the reading diodes (5) and the photosensitive zones (20).

24 Claims, 12 Drawing Figures

FIG_1

"PRIOR ART"

FIG_12

FIG_2

FIG_3

FIG_4

FIG_5

FIG_6

CHARGE TRANSFER PHOTOSENSITIVE DEVICE

BACKGROUND OF THE INVENTION

1. Field of the Invention

The present invention relates generally to electrical analysis of light images using charges transfer in a semiconductor. It relates more particularly to a two dimensional photosensitive device, and to a device for analyzing images using this photosensitive device.

2. Description of the Prior Art

Solid state devices are known in the prior art for the analysis of light images, which are intended to be used in television cameras for delivering an electrical video signal. They are characterized both in the arrangement of the photosensitive zone, and also the reading system and the removal of the charges created by the image. It is also well-known to use such charge transfer devices for carrying out these various operations as described. For example, in the work of SEQUIN and THOMPSETT: "Charge Transfer Device" New York (1975) (pages 152 to 169):

in the systems known as "raster transfer" or "interline structure", in which the light beams are received on charge transfer registers; in such device the charge transfer is achieved over large areas, thus constituting a drawback due to the fact that it is currently difficult to obtain high yields for the production of such large areas;

in charge injection devices called "CID", that do not present this drawback, but generally require a reinjection of the charges in the semiconductor substrate and have various drawbacks, e.g. noise and difficulties for defining the value of the necessary capacitances during and after the reading of the charges.

More generally, and in addition to the problems cited above, there is the the question of the compatibility of, both the time required for light integration and, also the time required for the charge transfer. For example, in the case of television screen scanning time, which is, according to the 625 lines standard, approximately 52 $\mu$s per line presentation and 12 $\mu$s per line return time.

SUMMARY AND OBJECTS OF THE PRESENT INVENTION

In order to satisfy these various requirements, the applicant has proposed a "line transfer" structure, described in French patent application No. 80 09112, which corresponds to U.S. Pat. No. 4,430,672 which mainly comprises:

a matrix with N lines×M photosensitive zones or points, the image to be read being projected on said matrix and converted into electrical charges;

a memory with M points, called "line memory", adapted for successively receiving the signal charges accumulated for each line;

a register such as a charged coupled device receiving parallel-wise the content of the line memory and emitting series-wise the electrical signal of image analysis.

An object of the present invention is a two-dimensional photosensitive device, specifically adapted for carrying out the here-above described matrix.

With this purpose, the device according to an aspect of the invention receives a light image and emits electrical signals of the image analysis, and comprises:

a plurality of photosensitive elementary zones, arranged on the same semiconductor substrate on N lines and M columns, said zones being insulated from each other, in said zones electrical charges being created depending upon the received light, each of the elementary zones comprising a MOS capacitance, forming a first zone for collecting the charges, comprising a single grid common to all capacitances of the same line, and a second zone for collecting the charges, electrically coupled to the capacitance;

connecting and controlling means, delivering parallel-wise the electrical charges created in the M photosensitive zones of the same line, and this successively for the N lines, said means comprising a plurality of reading diodes, arranged in columns between the elementary photosensitive zones, in order that each receives succesively on order the charges of at least two elementary zones, belonging to two different lines;

means forming a charge screen, arranged between each photosensitive zone and the connecting means, said screen means presenting a plurality of grids, brought to a constant voltage, and arranged in columns between reading diodes and the photosensitive zones.

Another object of the invention is an image analysis device comprising such a photosensitive device.

BRIEF DESCRIPTION OF THE DRAWINGS

The present invention is described herein-under, by way of non-limitative example, with the use of the accompanying drawings, in which:

FIG. 2 shows a first embodiment of the photosensitive device according to the invention;

FIG. 3. shows a first section of the device of FIG. 2;

FIG. 4 shows a second section of the device of FIG. 2;

FIG. 10 shows another embodiment of the device of FIG. 7;

FIG. 11 shows a cross-section of the device of FIG. 10;

DESCRIPTION OF THE PREFERRED EMBODIMENTS

In all these figures the same numbers refer to the same elements.

Figure 1:
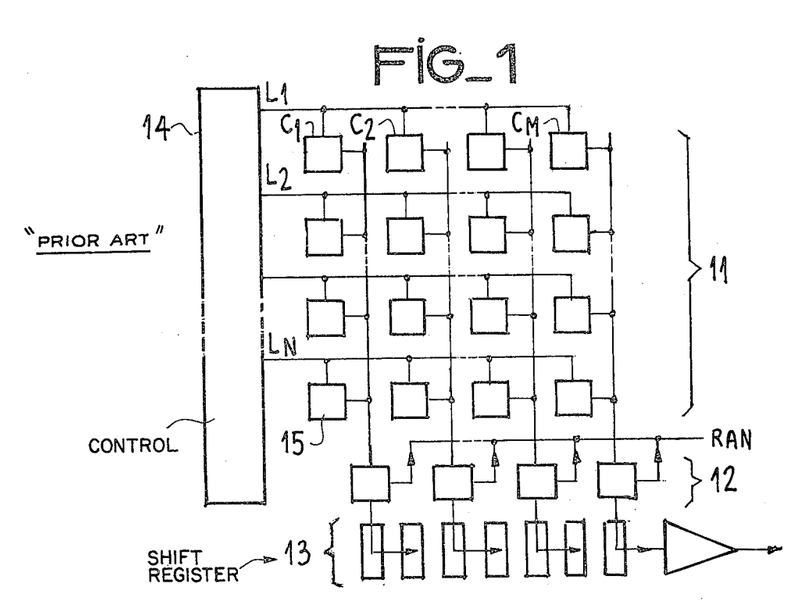
FIG. 1 shows the general organisation of a line transfer structure.

FIG. 1 shows the general organisation of a line tranfer structure, such as described in the above mentioned French patent application which corresponds to U.S. Pat. No. 4,430,672.

This structure mainly comprises a photosensitive zone 11, a line memory 12 and a shift register 13, of the CCD type.

The photosensitive zone receives the light image to be analysed and transforms it into electrical charges. In the present specification detection of image light includes not only the wave-lengths corresponding to visible light, but also lengths bordering on the visible, such as infra-red. The photosensitive zone is formed by a matrix of elementary zones 15, herein-after called points, arranged along N lines, referred to as $L_1$, $L_2$ ... $L_N$, and along M columns, referred to as $C_1$, $C_2$ ... $C_M$. The photosensitive points of the same line are joined to one another and connected with a control device 14 enabling the lines to be addressed in turn, this device formed, for example, by a shift register of the MOS type. The photosensitive points 11 of the same column are joined through a single connection to the line memory 12.

Line memory 12 receives thus parallel-wise the charges created in each of the photosensitive points 15 of the same line and then transfers them parallel-wise to shift register 13, which delivers the data series-wise, said data forming the video signal resulting from the analysis of the optical image received on photosensitive zone 11.

The sequence of the various integration phases of the image by the photosensitive zone 11, the line transfer in the line memory and then the signal transfer in CCD register 13 for each line is described here-under.

First of all, the image integration is permanently performed on the entirety of the photosensitive zone 11, except for the line that is addressed by register 14.

During line return, the contents of line memory 12 is transferred to shift register 13, the input of line memory then being closed.

During the following line time, the contents of register 13 are transmitted series-wise, the connection between line memory 12 and register 13 being interrupted. During a first phase, a return to the level of the reading means of points 15 occurs, through a connection RAN FIG. 1 connected to line memory 12, and during a second phase the transfer occurs from one of the L lines of zone 11 towards line memory 12, the selection (or addressing) of one lines being made by register 14. During the next step corresponding to line return time, the contents of line memory 12 is transferred to register 13, said contents having been read during the previous step.

Following another embodiment of the invention, the line selection and the transfer into the line memory and then into the shift register are completed during the line return time, the line time being devoted to the return to the level of reading means, which is improved with time, and to the discharge series-wise to the shift register.

FIG. 2 shows a first embodiment of the photosensitive device according to the invention.

In this figure are represented, arranged on a semiconductor substrate, such as silicon, coated with an insulating layer (such as silicon oxide), several conduction deposits, herein-after called, like any other conducting deposit, electrodes or grids which are metallic, possibly semi-transparent, or in polycrystalline silicon, along parallel lines $L(L_{i-2}, L_{i-1}, L_i$ on the figure) of the device according to the invention, and forming with the semiconductor substrate and insulating layer, photodetecting MOS capacitances. These grids are provided with recesses, substantially in the form of a circle, referred to as 16 on FIG. 2, and alternately positioned on either side of each line, the recesses of the two adjacent lines opposing each other. Along columns C of the device ($C_{i-1}$, $C_i$, $C_{i+2}$, $C_{i+2}$ on the figure) are positioned electrodes or grids 4, brought to a constant voltage, and forming a screen to the charges, as described herein-below. Each of the screen grids 4 has the shape of a strip with substantially circular extended sections 17, concentric with the recesses 16 and covering them.

Various lines L, materialized by grids 3, and the columns C materialized by grids 4 are separated from one another through two series of insulating barriers 1, shown on FIG. 2 by double lines, respectively parallel to the lines and the columns; this insulation is broken at the site of extended sections 17. Each of the insulating barriers 1 can be made by an increased thickness of oxide, or by overdoping of the substrate (e.g. P+ overdoping for a P substrate) or by the addition of two solutions, (i.e. overdoping beneath the increased thickness of the oxide). The quadrilateral formed by the intersection of insulating barriers 1 defines a photosensitive point, the capacitance of which being defined by the section of grids 3 of insulating layer 22 and substrate 21 between two insulating barriers 1 (FIG. 3). By way of example, one of these points, referred to as 20 on FIG. 2 at the intersection of line $L_i$ and column $C_i$ has been heavily underlined.

Grids 4 are provided with an opening 18 in the centre of the circular extended section 17, in each of which doping is carried out in order to form a diode 5 for the reading at said photosensitive point. It should be noted that in the embodiment according to FIG. 2, reading diodes 5 are common to two photosensitive points and are arranged in alternate rows from one column to the other.

Furthermore, in broken lines on FIG. 2 is shown an electrode 7 for each column, deposited substantially in the form of a strip, above the reading diodes 5, and having a contact zone 6 with said diodes 5, as shown in the centre of these diodes. These electrodes play a double role by both electrically connecting the diodes of the same column and forming a screen which is opaque to light and could create parasitory charges in reading diodes 5.

FIG. 3 shows a cross-section along line AA of photosensitive point 20, the section line simultaneously cutting grid 3, grid 4, diode 5, metal strip 7 and contact point 6 with diode 5, and insulating barriers 1.

In FIG. 3, appears more clearly the structure of the device of FIG. 2. In a semiconductor substrate 21 are formed two vertical insulting barriers, for example, through overdoping (zone 31), in the present example, and a reading diode 5 in the centre of the photosensitive point, also formed by overdoping of the substrate. The substrate is coated with an insulating layer 22. On layer 22 is deposited the grid 3 of MOS capacitances covering the insulating barriers 1, and leaving an opening 16 in the middle of FIG. 3. The screen grid 4 is placed on insulating layer 22 at the periphery of opening 16 and extends beyond grid 3, from which it is separated by an insulating layer (not shown on the drawing for simplicity's sake). Screen grid 4 presents in its centre an opening 18, for enabling connection 7 through opening 6 of insulating layer 22 to electrically contact reading diode 5. Electrode 7 covers both a part of insulating layer 22 and a part of screen grid 4, with an intermediary insulating layer between grids 4 and 7 (not shown on FIG. 3).

Figure 5:
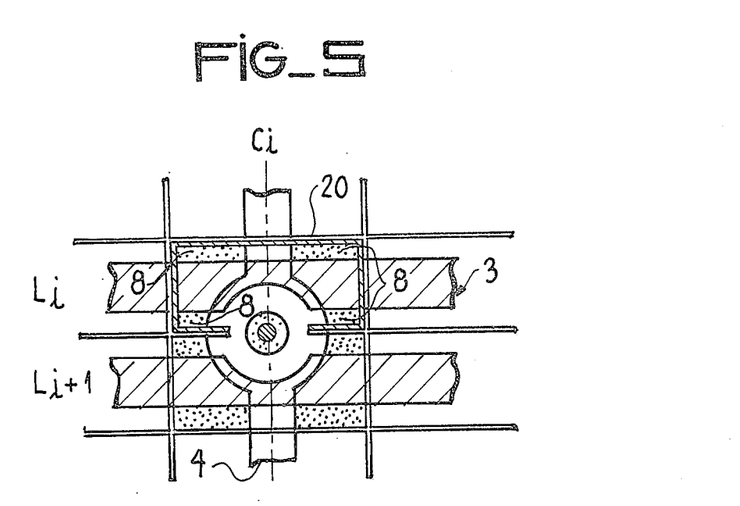
FIG. 5 shows another embodiment of the device shown in FIG. 2.

In this embodiment, the device comprises furthermore photodiodes 8, formed by doping the semiconducting substrate and positioned, as shown on FIG. 2, in the openings 19 of grids 3 of MOS capacitances, said diodes 8 being positioned so as to overlap each of the insulating column barriers 1 for each of the elementary photosensitive points such as 20, i.e. each photosensitive point had two half-diodes 8. In another embodiment (not shown in the figures) the zone covered by photodiodes 8 is not limited to the area shown on FIG. 2, but extends to the whole area taken up by grids 3 in order to improve the coupling capacitance-diode. In another embodiment, shown on FIG. 5, appear, except photodiodes 8, the same elements as those in FIG. 2, for two photosensitive points, diodes 8 are then located between grids 3 and insulating barriers 1, which are formed in this case by an increased thickness of oxide in order to facilitate the formation of said diodes by self-positioning of the diffusions with respect to this insulating barrier, on the one hand, and to grids 3 and 4, on the other hand. In this case, each of the photosensitve points comprises four photodiodes 8.

The device of FIGS. 2 and 3 works as follows and will be better understood in the light of the surface voltage curve shown beneath the cross-section of FIG. 3.

On this curve, the voltages are represented as increasing progressively towards the bottom of the figure, this corresponding to the fact that applied to an electrode, they create a voltage pit which traps the charges.

When a line is not selected by register 14 of FIG. 1, its voltage has a value represented by line 23 on FIG. 3, facing the grid 3 of MOS capacitance, limited on both sides by lower voltages: one voltage represented by line 27 corresponding to insulating barriers 1, and one voltage $V_E$ which is constant and applied to the screen grid 4, the value of which is chosen lower than the value of the voltage applied to grid 3 in order to create a voltage pit under grid 3, in which the charges created by the light can be accumulated (shaded section of the figure). In the centre of the curve, facing electrode 7, the voltage is, prior to reading by said photosensitive point, decreased to the value represented by 25, through the return to level means shown on FIG. 1. The value of said voltage must be higher than the voltage $V_E$ in order to prevent the invasion by parasitory charges in the voltage pits facing grids 3. When said photosensitive point, simultaneously with all other photosensitive points of the same line, is selected by register 14 the voltage applied to grid 3 is decreased to a value close to zero, as illustrated by line 26 in FIG. 3. This voltage is then lower than $V_E$, the charges accumulated during the previous step are then discharged into the central zone in order to be discharged thereafter through connection 7 as indicated by the arrows on FIG. 3.

It appears from the above-mentioned, that when the line is not selected by register 14, the charges created by the light accumulate in pit 23 facing electrode 3, during the return to level of the voltage of reading diodes 5; when the line is selected the accumlated charges are discharged into connection 7 and the device thus delivers parallel-wise the charges corresponding to the light received on said line.

FIG. 4 shows a cross-section of the device of FIG. 2, made parallel-wise to the previous AA cross-section, but through the photodiodes 8 along line BB of FIG. 2.

In this FIG. 4, is again shown semiconductor substrate 21 coated with an insulating layer 22. On layer 22 is deposited grid 3 which presents two openings 19 at the site of photodiodes 8 which are formed by doping substrate 21.

By way of example, vertical insulating barriers 1 are shown on this figure according to another possible embodiment, i.e. an increased thickness of insulating layer 42, this increased thickness extending both in the substrate 21 and beyond the remainder of insulating area 22. The insulating barrier can be re-inforced by an overdoping 41 of the substrate beneath the increased thickness of the oxide, this overdoping being of the same type as the overdoping 31 of FIG. 3. Beyond grid 3 are located screen grid 4 and column electrode 7, these various electrodes being separated from one another by insulating layers (not shown).

The structure of FIG. 2 associates at the site of each photosensitive point, a MOS capacitance (substrate 21, insulating layer 22 and electrode 3) forming a first charge collecting zone, and a second charge collecting zone in which a photodiode 8 is produced according to this embodiment. Indeed, MOS capacitance has a charge accumulating capacity which is large and enables obtention of good dynamics at any given photosensitive point. The second charge collecting zone enables the elimination of short wave-length absorption which occurs in the capacitance grid; furthermore, diode 8 which is produced in this collecting zone, and which is not compulsory for the working of the device, allows an increased sensitivity of the photosensitive zone. Moreover, the reading diodes located in alternate rows offer a more regular vertical resolution. Further, column electrode 7 collecting the charges is placed upon the screen grid 4 brought to a given voltage, which insulates from all parasitory influence.

Figure 6:
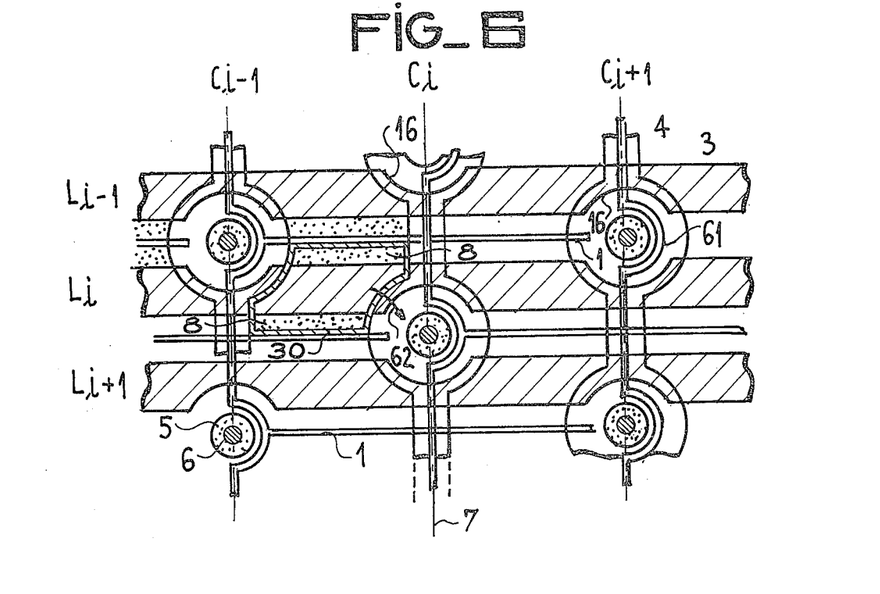
FIG. 6 shows another embodiment of the device shown in FIG. 2.

FIG. 6 shows another embodiment of the device of FIG. 2 in which the charge collecting column does not pass through the middle of the photosensitive points but on the edges.

In FIG. 6, are shown grids 3 of MOS capacitances, along parallel strips, provided with recesses 16 in which are located reading diodes 5, arranged in lines and columns, in alternate rows as here-above. The screen grids 4 are also located as in the previous figures. The charge collecting zones, formed by the photodiodes 8, are located here on both sides of grids 3. As hereinabove and as in the various embodiments herein-after described, diodes 8 can extend beneath grid 3 in order to improve diodes capacitances coupling. The grids 3 are again insulated from one another by horizontal barriers 1 and the photosensitive points are vertically insulated from one another by insulating barrier 61 which is here located on the same line as reading diodes 5 but turning around said diodes, for example, on the right as shown in FIG. 6.

Each photosensitive zone is here defined by the section of grid 3 limited by two successive screen grids 4 and two photodiodes 8; such a photosensitive point is shown on FIG. 6 by a heavy line and referred to as 30. When reading this photosensitive point 30 delivers its charges to the next reading diode 5 from which it is not separated by an insulating barrier 61, as shown by arrow 62 on FIG. 6.

The device of FIG. 6 comprises furthermore column connections allowing the collecting diodes 5 to be electrically joined to one another in the same column and to form an opaque screen, such as shown in the previous figure, said connections not being shown for simplicity's sake.

In a variation (not shown) the diode zone of each photosensitive point is not divided into two portions on both sides of grid 3 but may be produced in an opening provided in the center of the grid and/or extended beneath said grid.

This arrangement as described in FIG. 6 is especially convenient when the photosensitive device according to the invention is applied to colour images analysis.

Indeed, as it is well-known in this case, the moire effect is bound to the presence of coloured filters on the photosensitive points; in accordance with a preferred embodiment of the invention, the opaque charge collecting zones are located on the edge of the points in order to allow a potential coverage of the filters of the adjacent points, i.e. a greater tolerance in their size ranges.

When the collecting columns (diodes 5 and electrodes 7) are located in the centre of photosensitive points the drawbacks caused by "spectrum overlapping" are sharply reduced. Such "spectrum overlapping" occurs, for example, when a photosensitive device is used where the photosensitive points are periodically located and separated by distance D.

If d is the opening of the photosensitive point, (i.e. its dimension along the axis where the photosensitive points are separated by distance D), the curve corresponding to the light signal amplitude depending upon the space frequency is maximum for zero and then, nil for $1/d$, $2/d$, $3/d$, . . . .

Furthermore, due to selected sampling, a superimposition occurs with the parasitory frequency response formed by the spectrum overlapping herein-above mentioned, i.e. by a spectrum which is maximum for $1/D$ and nil for $1/D - 1/d$, then $1/D - 2/d$ . . . .

This overlapping effect of the spectrum causes more of a nuisance in proportion to the increase of the distance D between the photosensitive points, compared to the opening d of a point.

Thus, when the collecting columns are on one edge of the photosensitive points, the distance D between two adjacent points is greater than the opening d of the photosensitive point due to the existence of opaque zones formed by electrodes 7.

On the contrary, when the collecting columns are in the centre of the photosensitive points, as shown in FIG. 3, opening d of photosensitive point is increased due to the overlapping between each photosensitive zone and the two adjacent zones which are separated from it by a single insulating barrier 1 and by an opaque screen.

The increase of photosensitive points' opening d compared to the distance D between two adjacent points allows the reduction of the drawbacks caused by the spectrum overlapping.

Figure 7:
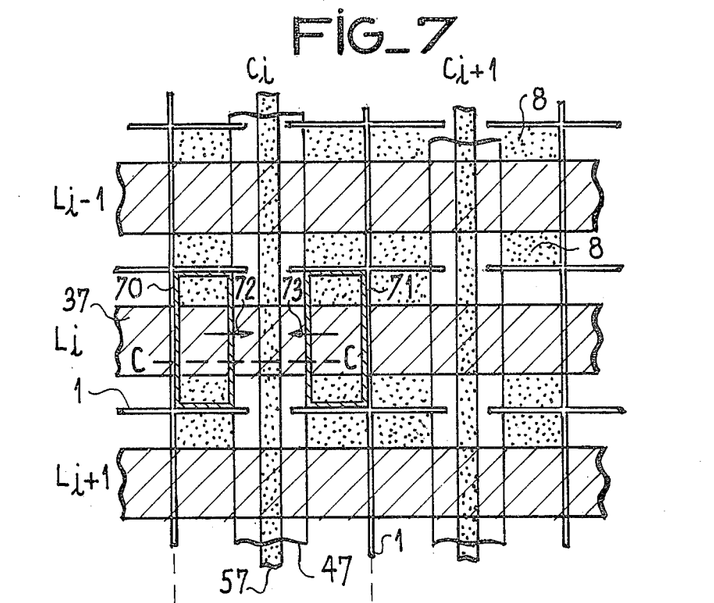
FIG. 7 shows a second embodiment of the photosensitive device according the invention; invention.

FIG. 7 shows a second embodiment of the device according to the invention in which the geometrical arrangements have been simplified in order to use reduced scales, and consequently, the production of a photosensitive zone with a higher resolution.

Figure 8:
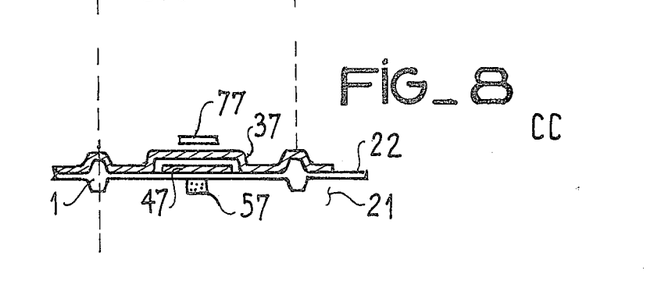
FIG. 8 shows a first section of the device shown in FIG. 7.

The device shown in FIG. 7, a cross-section of which along line CC being shown in FIG. 8, comprises MOS capacitances formed by rectangular conducting strips 37, without the recesses shown in the previous embodiments, said strips being deposited on the semiconductor substrate 21 coated with an insulating layer 22; these grids are separated from one another through horizontal insulating barriers 1 formed by an increased thickness of insulating layer, possibly reinforced by overdoping as herein-above described. The device comprises furthermore vertical insulating barriers 1 delimiting the columns ($C_i$, $C_{i+1}$ in the figure). In the middle of each zone delimited by the insulating barriers, is produced a diode 57, through diffusion in substrate 21, extending over the whole length of the column, the horizontal insulating barriers 1 being broken at the site of the diffusion; said diffusion is as herein-above covered with a screen grid referred to as 47, deposited on the insulating layer 22, grid 37 being deposited on the insulating layer (not shown) which is deposited on the screen grid 47 as shown in FIG. 8. As previously shown, the device comprises a metal strip 77 (FIG. 8) covering grid 37 on the site of diode 57, this metal strip not having to collect the charges but only to form an opaque screen between the light image and diode 57.

The zone comprised between two successive insulating barriers, horizontally and vertically delimits two photosensitive half zones 70 and 71 heavily underlined in FIG. 7, forming a photosensitive zone corresponding to column $C_i$ and line $L_j$: these two half zones 70 and 71 discharge their charges as indicated respectively by arrows 72 and 73, in the same reading diode 57.

Figure 9:
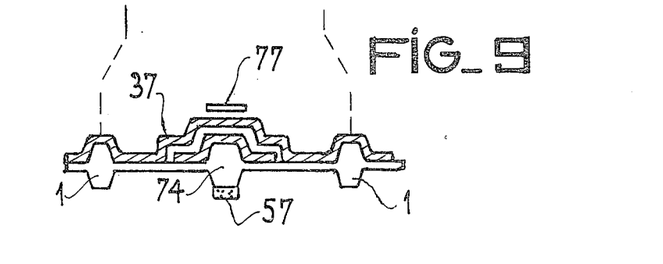
FIG. 9 shows another embodiment seen in cross-section of the device of FIG. 7.

FIG. 9 shows a variation of the device of FIG. 7, seen in cross-section, allowing the reduction of the collecting column capacitance which is an important parameter, the reduction of which increases the speed and efficiency of the transfer.

The only difference between FIG. 9 and FIG. 8 is the formation of the increased thickness of insulating layer 74 beyond diode 57, which can be produced, for example, by local oxidation delimited (e.g. by silicon nitride) in accordance with a well-known method, made after the diffusion of zone 57 and immediately beyond it. The screen grid 47 is then deposited on this increased thickness 74 and on both sides of it, and grid 37, as previously mentioned, over screen grid 47, and then metal strip 77 beyond grid 37 on the site of diffusion 57. This arrangement allows a substantial reduction of the capacitance between elements 57 and 47.

FIG. 10 shows a variation of the device of FIG. 7, of the same type of variation as shown in FIG. 6, i.e. a structure which is derived from FIG. 7 in which the reading diode does not pass through the middle of the photosensitive zone but on one of its edges.

This device such as that of FIG. 7, comprises a semicondctor substrate 21 coated with an oxide layer 22 presenting increased thicknesses 1 for horizontally and vertically insulating photosensitive points such as 80 from one another. Each photosensitive point is formed by a MOS capacitance comprising an electrode 37 deposited on the insulating layer 22, and on both sides of electrode 37, photodiodes 8, horizontally insulated from one another by an insulating barrier 1.

One vertical edge of the photosensitive points such as 80 is delimited by the insulating barrier 1 and the other edge (to the right on FIG. 10) is arranged in order that the charges accumulated when the point is receiving light can be discharged into the reading diode 57. With this aim, diode 57 is formed in substrate 21 along columns adjacent to insulating barriers 1 (to the left on the figure), these diodes are covered with a screen grid 47, deposited on insulating layer 22 and on a portion of the increased thickness 1, grid 37 being deposited on layer 22 on the site of the photosensitive point itself, and then on an insulating layer deposited on screen grid 47. The metal strip 77 covers grid 37, through an insulating layer, in the same way as the example of FIG. 7, and for the same protection against parasitory charges which could be created by light in diodes 57.

The device of FIG. 7 improves that of FIG. 10 in sharply reducing the drawbacks due to the spectrum overlapping, as herein-above explained.

In the various embodiments previously described, it is possible to remove photodiodes 8, the charge collecting function being assumed by the substrate itself. The present embodiment is more simple, although the sensitivity is slightly decreased.

Figure 12:
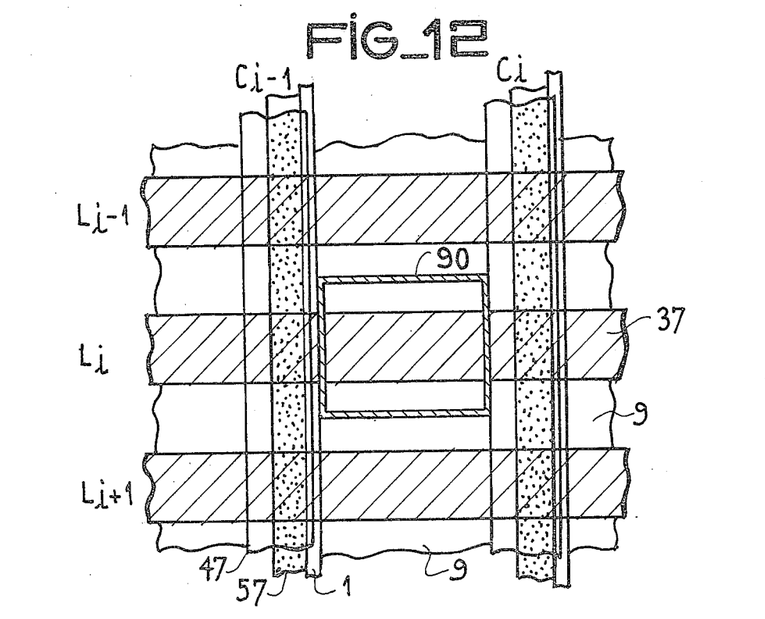
FIG. 12 shows a third embodiment of the photosensitive device according to the invention.

FIG. 12 shows another embodiment of the device according to the invention, in which the removal has been made.

In FIG. 12, as in FIG. 10, are shown, grids 37 made by MOS capacitances, parallel-wise arranged together, and materialising lines ($L_{i-1}$, $L_i$, $L_{i+1}$ in the figure) the vertical insulating barriers 1, formed by an increased thickness of oxide, possibly reinforced by an overdoping made underneath; reading diodes 57 extending along the whole length of columns ($C_{i-1}$, $C_i$ in the figure) and along the insulating barriers 1 (on the left of these barriers in the figure) and screen grids 47 extending on the insulating layer covering the substrate, beyond diodes 57 and barriers 1.

In this embodiment, insulation between lines is not carried out as the vertical insulation, but by zones 9 where the substrate is overdoped, extending continuously between grids 37, except on the site of screen grid 47, diodes 57 and insulating barriers 1. Zones 9 are produced by self-positioning relatively to zones 1, 37 and 47. Photosensitive point 90 is delimited on FIG. 12 by a heavy line. It comprises horizontally the portion of grid 3 comprised between an insulating barrier 1 and the next screen grid 47, and vertically two half-widths of insulating layer 9 located on both sides of said portion of grid 3.

In this device, the electrical charges are created by the light inside and moreover under the overdoping 9, and they are drawn towards MOS capacitances 37 and then towards reading diodes 57.

The main advantage of this embodiment is its great simplicity.

Practically, the structure such as described in FIGS. 7, 10 or 12, allows a much reduced pitch between photosensitive points (for example, 12 $\mu$m in height and 24 $\mu$m in width in FIG. 10), with a large photosensitive area compared to the opaque area which is necessary for reading—(photosensitive area of 70% of the total area).

The drawback of the structures shown in FIGS. 7 to 12, in which the reading diodes are in the form of strips, is that collecting columns capacitances are much higher than those of the structures shown in FIGS. 2 to 6, in which reading diodes are discrete.

Thus, in the case of FIG. 11, despite the increased thickness of the insulating layer beyond diode 57, the strip diode 57 has a large capacitance in relation to the substrate and the screen grid 47 which covers it. Indeed, it is not recommended to deposit a too thick layer of oxide between screen grid 47 and diode 27 in order that the screen grid performs satisfactorily as a screen.

Thus, for example, when reading the signal, a charge quantity of 0.1 pC on a capacitance of 10 pF, can be obtained and consequently, a very low voltage variation.

On the contrary, in FIGS. 2 and 3, the diode 5 area is reduced to the minimum and, consequently, the capacitance. Furthermore, the screen grids 4 do not extend beyond diodes 5, and electrodes 7 which join the diodes and form a screen to the light, can be placed apart from the screen grids 4.

The capacitance of the discrete diode assembly of a column is thus, for example, five times lower than the capacitance of a strip diode, when used in 580 lines television. Reading is thus improved.

Furthermore, the production technology of the discrete diodes is easier than that of the strip diodes.

We claim:

1. Charge transfer photosensitive device adapted to receive a light image and emitting electrical signals of analysis of this image, wherein said device comprises:

a plurality of elementary photosensitive zones, arranged on the same semi-conductor substrate on N lines and M columns, said zones being insulated from one another, in said zones electrical charges being created depending upon the light received, each of the elementary zones comprising a MOS capacitance forming a first zone for collecting the charges, comprising a single grid common to all capacitances of the same line, and a second zone for collecting the charges, electrically coupled to the capacitance;

connecting and controlling means, delivering parallel-wise the electrical charges created in the M photosensitive zones of the same line, and this successively for the N lines, said means comprising a plurality of reading diodes, arranged in columns between the elementary photosensitive zones, in order that each receives successively on order the charges of two elementary zones, belonging to two different lines;

means forming a charge screen, arranged between each photosensitive zone and the connecting means, said screen means presenting a plurality of grids, brought to a constant voltage and arranged in columns between reading diodes and the photosensitive zones;

a memory of M points, called line memory, successively receiving the charges accumulated by each line, from connecting and controlling means;

a shift register, receiving parallel-wise the contents of the line memory and delivering successively an electrical signal forming the image analysis signal.

2. Charge transfer photosensitive device, adapted to receive a light image and emitting electrical signals of analysis of this image, wherein said device comprises:

a plurality of elementary photosensitive zones, arranged on the same semiconductor substrate on N lines and M columns, said zones being insulated from one another, in said zones electrical charges being created depending upon the light received, each of the elementary zones comprising a MOS capacitance forming a first zone for collecting the charges, comprising a single grid common to all capacitances of the same line, and a second zone for collecting the charges, electrically coupled to the capacitance;

connecting a controlling means delivering parallel-wise the electrical charges created in the M photosensitive zones of the same line, and this successively for the N lines, said means comprising a plurality of reading diodes in the shape of a band, arranged in columns between the elementary photosensitive zones, in order that each receives successively, on order the charges of N elementary zones, belonging to N different lines;

means forming a charge screen, presenting a plurality of grids, in the shape of band, brought to a constant voltage, said reading diodes in the shape of a band being formed in the semiconductor substrate under each of the screen grids and having a width smaller than the bands of the screen grids, and wherein the screen grids in the shape of a band are passing through each of the photosensitive zones substantially at its centre;

a memory of M points, called line memory, successively receiving the charges accumulated by each line, from connecting and controlling means;

a shift register, receiving parallel-wise the contents of the line memory and delivering successively an electrical signal forming the image analysis signal.

3. A device according to claim 1, wherein the means forming the screen comprise one grid per column, in the form of a band having a series of extended sections and an opening substantially in the middle of the extended section, the reading diodes formed in the semiconductor substrate being positioned in each of the said openings.

4. A device according to claim 3, wherein the connecting and controlling means comprise, among others, a conducting band which is opaque to the light image, said band being positioned for each column above the screen grid, said band having a width at least equal to that of the reading diodes, and ensuring the electrical connection of the reading diodes of the same column.

5. A device according to claim 4, wherein the screen grids pass through each of the phtosensitive zones substantially at its centre.

6. A device according to claim 3, wherein the screen grids pass through each of the photosensitive zones substantially at its centre.

7. A device according to claim 2, wherein said device comprises, further, a band opaque to the light image and has a width at least equal to that of the reading diodes, said band being positioned above the screen grid, for each of the columns.

8. A device according to any one of claims 1, 3, 4, 5, or 6, wherein the reading diodes are placed alternately in rows.

9. A device according to one of claims 3, 4, 5, or 6, wherein the screen grids are positioned on one of the sides of the photosensitive zones.

10. A device according to one of claims 3, 4, 5, or 6 wherein the screen grids are positioned on one of the sides of the photosensitive zones and the insulation of the photosensitive zones from one another is made vertically in a continuous manner, according to the alignment in columns of the reading diodes by working around them on the same side, and horizontally between two MOS grids, in a continuous manner, except at the site of the reading diodes.

11. A device according to claim 10 wherein the insulation comprises an increased thickness of the insulating zone coding of the semi-conductor substrate.

12. A device according to claim 10 wherein the insulation comprises an overdoping of the semiconductor substrate.

13. A device according to claim 1, wherein the insulation of the photosensitive zones from one another is made vertically in a continuous manner between the two screen grids, substantially in the centre of the space, and horizontally between the two MOS capacitance grids, in a continuous manner, except at the site of the reading diodes.

14. A device according to claim 2, wherein the insulation of the photosensitive zones from one another is made vertically in a continuous manner between two screen grids, substantially in the centre of the space, and horizontally between the two MOS capacitance grids, in a continuous manner, except at the site of the reading diodes.

15. A device according to one of claims 13 or 14, wherein the insulation comprises an increased thickness of the insulating zone coating the semiconductor substrate.

16. A device according to one of claims 13 or 14, wherein the insulation comprises an overdoping of the semiconductor substrate.

17. A device according to claim 15 wherein the insulation comprises among others, an overdoping of the substrate located under the increased thickness.

18. A device according to claim 8, wherein the screen grids are positioned on one of the sides of the photosensitive zones.

19. A device according to claim 1 or 2, wherein the connection and controlling means comprise N lines selecting means, ensuring to only one of the N grids of the MOS capacitances, the application of a voltage allowing the transfer of charges of the MOS capacitance and the charge collecting zone towards the reading diodes.

20. A device according to either one of claims 4 or 7, wherein the strip opaque to the light image is made of aluminium.

21. A device according to claim 1 or 2, wherein each of the second charge collecting zones if formed by a diode.

22. A device according to claim 21, wherein the diode extends, among others, beneath the MOS capacitance grid of each of the photosensitive zones.

23. A device according to claims 2 or 3, wherein each photosensitive zone comprises two charge collecting zones, located in two openings provided in the grid of MOS capacitance at the site where said grid is not covered by the screen grid.

24. A device according to claim 1 or 2, wherein each photosensitive zone comprises charge collecting zones located at the sites of the photosensitive zones left free by the screen grid and the MOS capacitance grid.

* * * * *